(12) United States Patent
Van Den Hoek et al.

(10) Patent No.: US 9,171,966 B2
(45) Date of Patent: Oct. 27, 2015

(54) IMPLANTATION OF GASEOUS CHEMICALS INTO CAVITIES FORMED IN INTERMEDIATE DIELECTRICS LAYERS FOR SUBSEQUENT THERMAL DIFFUSION RELEASE

(75) Inventors: Willibrordus Gerardus Van Den Hoek, Saratoga, CA (US); Robertus Petrus Van Kampen, S-Hertogenbosch (NL); Richard L. Knipe, McKinney, TX (US); Charles Gordon Smith, Cambridge (NL)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 14/352,057

(22) PCT Filed: Apr. 19, 2012

(86) PCT No.: PCT/US2012/034210
§ 371 (c)(1),
(2), (4) Date: Apr. 15, 2014

(87) PCT Pub. No.: WO2012/145485
PCT Pub. Date: Oct. 26, 2012

(65) Prior Publication Data
US 2014/0246740 A1    Sep. 4, 2014

Related U.S. Application Data

(60) Provisional application No. 61/477,568, filed on Apr. 20, 2011.

(51) Int. Cl.
*H01L 29/84* (2006.01)
*B81C 1/00* (2006.01)
(Continued)

(52) U.S. Cl.
CPC .............. *H01L 29/84* (2013.01); *B81B 3/0059* (2013.01); *B81B 7/0035* (2013.01); *B81C 1/00285* (2013.01); *B81C 1/00682* (2013.01); *B81B 2203/0127* (2013.01)

(58) Field of Classification Search
CPC .... H01L 29/84; B81B 3/0059; B81B 7/0035; B81C 1/00682; B81C 1/00285
See application file for complete search history.

(56) References Cited

U.S. PATENT DOCUMENTS 5,919,548 A * 7/1999 Barron et al. ................. 428/138
5,963,788 A * 10/1999 Barron et al. ................... 438/48
(Continued)

FOREIGN PATENT DOCUMENTS

WO    WO-2006/067784 A1    6/2006

OTHER PUBLICATIONS

International search report and written opinion for PCT/US2012/034210 dated May 12, 2012.

*Primary Examiner* — Michele Fan
(74) *Attorney, Agent, or Firm* — Patterson & Sheridan, LLP

(57) ABSTRACT

The present invention generally relates to methods for increasing the lifetime of MEMS devices by reducing the landing velocity on switching by introducing gas into the cavity surrounding the switching element of the MEMS device. The gas is introduced using ion implantation into a cavity close to the cavity housing the switching element and connected to that cavity by a channel through which the gas can flow from one cavity to the other. The implantation energy is chosen to implant many of the atoms close to the inside roof and floor of the cavity so that on annealing those atoms diffuse into the cavity. The gas provides gas damping which reduces the kinetic energy of the switching MEMS device which then should have a longer lifetime.

16 Claims, 4 Drawing Sheets

(51) Int. Cl.
*B81B 3/00* (2006.01)
*B81B 7/00* (2006.01)

(56) References Cited

U.S. PATENT DOCUMENTS

| | | | |
|---|---|---|---|
| 6,012,336 A * | 1/2000 | Eaton et al. | 73/754 |
| 6,174,820 B1 * | 1/2001 | Habermehl et al. | 438/745 |
| 7,514,283 B2 | 4/2009 | Partridge et al. | |
| 2002/0084510 A1 * | 7/2002 | Jun et al. | 257/536 |
| 2003/0085438 A1 | 5/2003 | Habibi et al. | |
| 2004/0115856 A1 | 6/2004 | Jung et al. | |
| 2008/0180890 A1 * | 7/2008 | Bolis | 361/679 |
| 2009/0026559 A1 * | 1/2009 | Detry | 257/414 |
| 2010/0155865 A1 * | 6/2010 | Sugiura et al. | 257/417 |
| 2010/0294024 A1 * | 11/2010 | Kumar et al. | 73/38 |

\* cited by examiner

IMPLANTATION OF GASEOUS CHEMICALS INTO CAVITIES FORMED IN INTERMEDIATE DIELECTRICS LAYERS FOR SUBSEQUENT THERMAL DIFFUSION RELEASE

BACKGROUND OF THE INVENTION

1. Field of the Invention

Embodiments of the present invention generally relate to introducing a gas into a micro cavity to enhance the lifetime of a micro-electromechanical system (MEMS) devices.

2. Description of the Related Art

A digital variable capacitor (DVC) utilizing MEMS technology operates by having a switching element of the MEMS device move between a state of high capacitance and a state of low capacitance. In a state of high capacitance, the switching element is in a position adjacent an RF electrode. In a state of low capacitance, the switching element is in a position adjacent to another electrode spaced from the RF electrode, or more specifically, away from an insulating layer that is disposed on the RF electrode. The switching element may also be moved to ground whereby the switching element is adjacent neither the RF electrode nor the other electrode.

During the lifetime of the MEMS device, the switching element cycles between the various states (i.e., high capacitance, low capacitance and ground). For a cycle, the switching element moves from the ground state to either the high or low capacitance state. After the cycle is completed, and before the next cycle, the switching element returns to the ground state. Then, a new cycle begins whereby the switching element moves to either a high or low capacitance state, or remains in the ground state. This corresponds to a physics movement of a plate which either touches the insulating layer overlying the RF electrode or touches the roof of the cavity in which it is housed.

There are only a finite number of times that the switching element can move before the MEMS device fails. With each movement of the switching element, the MEMS device accumulates a finite amount of damage which, given enough total cycles, results in failure. The magnitude of the finite damage to the MEMS device or the roof of the cavity or the insulating layer overlying the RF electrode is proportional to the impact speed of the fast moving switching element as the switching element is brought into contact therewith. In the above example the contact can cause material to be ejected from the exposed surfaces which then enter between the plates of the capacitor, reducing the closest distance that the ground MEMS plate can make to the insulating layer over the RF electrode. Thus, the maximum possible capacitance is reduced.

Therefore, there is a need in the art for increasing the lifetime of MEMS devices in DVCs by reducing the impact velocity of the switching element in a MEMS device as the switching element makes contact with various surfaces within the device cavity.

SUMMARY OF THE INVENTION

The present invention generally relates to methods for increasing the lifetime of MEMS devices by reducing the impact velocity of a switching element in the MEMS device. Rather than leaving the encapsulated MEMS device in a vacuum cavity, atoms are implanted into the cavity to introduce an inert gas into the cavity after the cavity has been sealed in the vacuum state. Introducing gas into the cavity causes gas damping and thin film damping which reduces the final impact speed.

In one embodiment, a method of MEMs fabrication comprises fabricating a MEMs device, the MEMs device having a cavity sealed by an encapsulating layer, implanting atoms into one of more of the encapsulating layer and another layer bordering the cavity and annealing the MEMs device to release the atoms into the cavity and pressurize the cavity.

In another embodiment, a MEMs device includes a first cavity having a switching element therein movable between a first position and a second position, a second cavity disposed adjacent the first cavity, a channel connecting the first cavity to the second cavity and atoms implanted into a portion of a boundary of the second cavity.

In another embodiment a MEMs device or set of MEMs devices are housed in a cavity under high vacuum. For example, the MEMs device may be a DVC consisting of a conducting beam that is electrically grounded and movable from a position close to a radio frequency (RF) electrode (i.e., a high capacitance state) that may be on the substrate and that is coated with a thin layer of insulator. The conductive beam is pulled into the high capacitance state by applying a voltage to the electrodes adjacent the RF electrode which is also coated with a thin insulator. The conductive beam can then be pulled to the roof of the cavity when a voltage is applied to an electrode (i.e., a pull-up electrode) above the conductive beam. An insulator under the pull-up electrode prevents the voltage on the pull-up electrode leading to current flow to the conductive beam (i.e., a low capacitance state). The low capacitance state moves the grounded conductive beam away from the RF electrode leading to the low capacitance state for the RF electrode. Typically voltages of between 10V and 30V are applied to move the conductive beam between the low and high capacitance states. These high voltages cause the conductive beam to accelerate across the cavity and land on the insulating material with velocities that can be greater than 1 m/s. These devices have to switch many hundreds of millions of times and if the impact velocity is too great, eventually material wears off the surfaces leading device failure. By introducing a gas into the cavity, the air under the conductive beam needs to move out the way as the beam makes contact with the insulating material. The gas has to flow laterally through an ever decreasing gap leading to an increased pressure in the narrow gap between the conductive beam and the surface it is approaching. This pressure causes a declaration force which slows down the conductive beam as the conductive beam lands reducing the impact damage.

Ion implantation of non reactive gases such as argon, nitrogen, or helium is available in semiconductor processing fab and is used to inject dopant into semiconductor substrates. A high voltage is used to accelerate ions to a very high velocity, these can be combined with a beam of electrons to then neutralize their charge before they enter the substrate. The high velocity ensures that most of the atoms come to rest some distance below the surface of the semiconductor. In this embodiment the ion acceleration would be adjusted to deposit most of the ions at a depth comparable to the thickness of the top layers of the cavity. There will be a distribution of depths where the atoms will come to a halt, and this will mean a large percentage of those atoms injected will come to rest either just above the cavity or just below. This may be an issue if there is a switching element in the cavity as the ions will then come to rest in the switching element itself, which may cause damage or a change in stress in the top surface leading to curvature of the switching element. To get around this issue a second cavity will be provided next to the MEMs cavity and joined by a pipe-like channel. An extra layer of masking material can be placed over the cavity containing the MEMs device and then be removed from over the empty cavity. The atom implanting process then implants atoms into the removable layer above the MEMs cavity (i.e., the masking material), but into the cavity and regions closely spaced just above and below the empty cavity. Subsequent annealing will then cause the gas to come out of the empty cavity walls and enter the empty cavity where pressure equalization will lead to gas diffusing into the cavity containing the switching element. The final stage of the process is to remove the masking material which has protected the MEMs cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to methods for increasing the lifetime of MEMS devices by reducing the impact velocity of a switching element in the MEMS device. Rather than leaving the encapsulated MEMS device in a vacuum cavity, atoms are implanted into the cavity to introduce an inert gas into the cavity after the cavity has been sealed in the vacuum state. Introducing gas into the cavity causes gas damping and thin film damping which reduces the final impact speed.

Figure 1A:
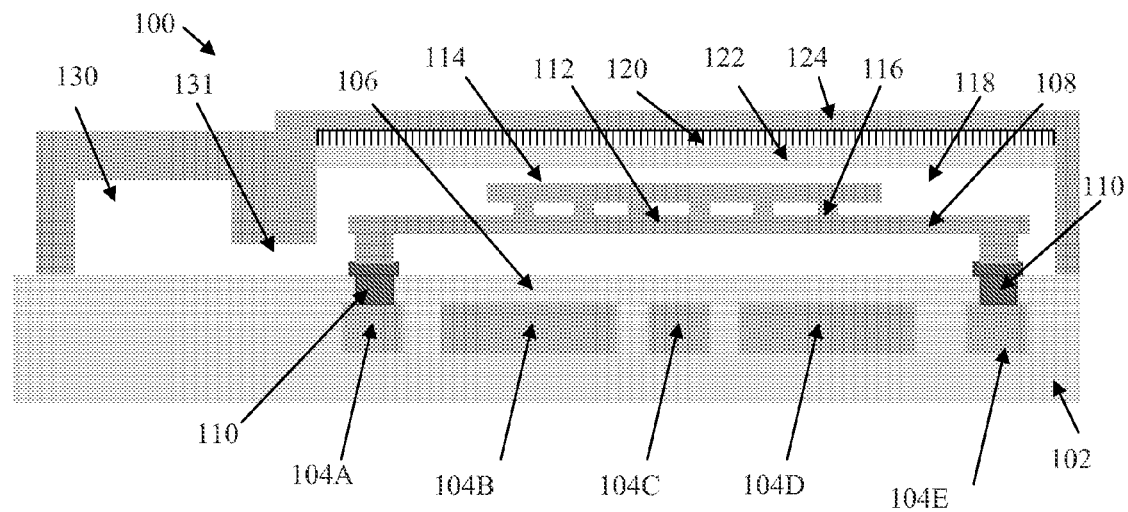
FIG. 1A shows a MEMS device in a cavity connected to a neighboring empty cavity.

FIG. 1A shows a MEMS device 100 in the ground state according to one embodiment. The MEMS device 100 includes a substrate 102 having a plurality of electrodes 104A-104E formed therein. Two electrodes 104B, 104D are referred to as 'pull-in' electrodes because the electrodes 104B, 104D are used to pull the switching element 108 towards electrode 104C. Electrode 104C is an RF electrode. Electrodes 104A, 104E provide the ground connection to the switching element 108 through vias filled with electrically conductive material 110. An electrically insulating layer 106 is formed over the electrodes 104B-104D. In one embodiment, insulating layer 106 may comprise silicon dioxide, silicon nitride, or combinations thereof.

The switching element 108 may comprise an electrically conductive material such as titanium nitride or an alloy of aluminum titanium nitride. In one embodiment, the titanium nitride may be coated with a thin layer of electrically insulating material. The switching element 108 is shown to have a bottom layer 112 and a top layer 114 that are connected by one or more posts 116. It is to be understood that the switching element 108 is contemplated to have other arrangements as well. Additionally, it is to be understood that both the top and bottom layer 112, 114 of the switching element 108 are contemplated to comprise titanium nitride having a thin layer of electrically insulating material thereon, but other materials are contemplated as well. The switching element 108 is disposed within a cavity 118 and movable within the cavity 118 between the low capacitance, high capacitance and ground states.

Above the switching element 108, another electrode 120, sometimes referred to as a 'pull-up' or 'pull-off' electrode, is present. A thin layer 122 of electrically insulating material is disposed between the electrode 120 and the cavity 118 such that the layer 122 bounds the cavity 118. The cavity 118 is sealed with a capping layer 124 that encapsulates the cavity 118.

Next to the cavity 118 containing the switching element 108 is a separate cavity 130. Cavity 130 is connected to cavity 118 containing the switching element 108 by the pipe or channel 131. Cavity 130 can be used to introduce atoms into the cavity 118, which would reduce the impact velocity of the switching element 108 in the cavity 118. The atoms may be injected into the cavity 130 by an ion implantation process.

The MEMS device 100 may be formed as follows according to one embodiment. The substrate 102 is patterned by forming a mask thereover and etching the substrate 102 to form the trenches into which the electrically conductive material forming the electrodes 104A-104E will be formed. Thereafter, the mask is removed and the electrically conductive material is deposited into the trenches to form the electrodes 104A-104E. The electrically insulating layer 106 is then deposited thereover. Another mask is then formed over the electrically insulating layer 106 so that vias may be formed that will be filled with electrically conductive material 110. The vias are etched into the insulating layer to expose the electrodes 104A, 104E, and then the mask is removed. The electrically conductive material 110 is then deposited in the vias.

A sacrificial material is then deposited over the electrically insulating layer 106. The switching element 108 is then formed in the sacrificial material and additional sacrificial material is formed over the switching element 108. The sacrificial material forms the boundary of the cavities 118, 130 that are to be formed. An electrically insulating layer 122 is then formed over the topmost sacrificial layer followed by the electrode 120. A hole is formed through the capping layer 124, electrode 120 and insulating layer 122 to expose the sacrificial material. Etchant is introduced to the cavity 118 to remove the sacrificial material and thus form cavity 118 and cavity 130. Within cavity 118, the switching element 108 is free to move in response to electrical current applied to the electrode 120 or the pull-in electrodes 104B, 104D. An additional encapsulating layer may be deposited thereover to seal the cavities 118, 130. After the sealing, atoms may be implanted into cavity 130 through an ion implantation process.

Figure 1B:
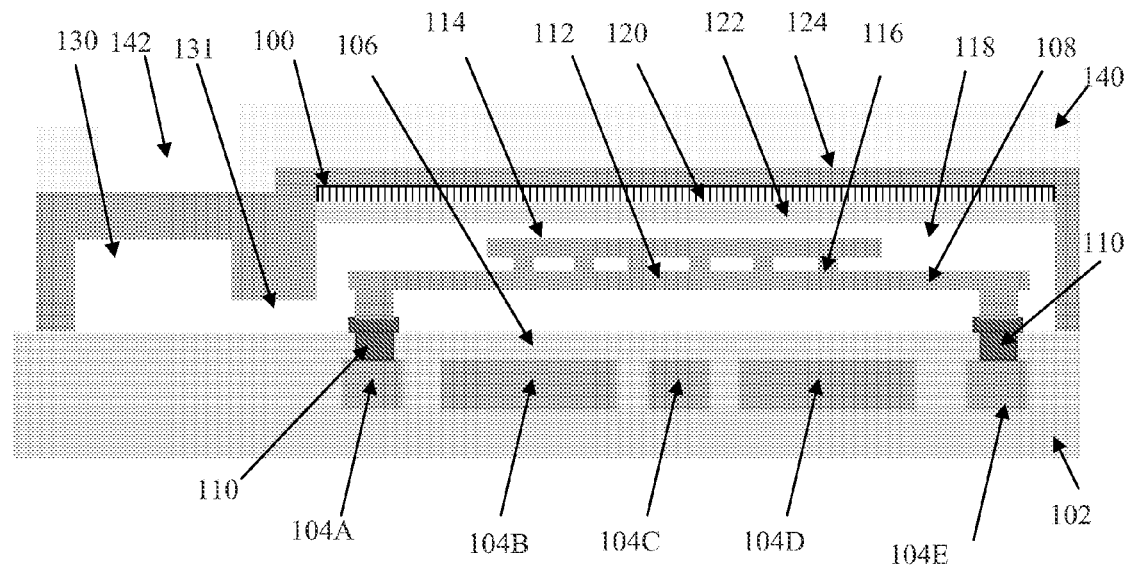
FIG. 1B shows the MEMS device and cavities of FIG. 1A after addition of the masking layer.

In order to implant the atoms into the cavity 130, a mask 140 is formed over the capping layer 124. FIG. 1B shows the MEMS device 100 having cavity 118 and cavity 130 adjacent thereto. A mask 140 is formed over the capping layer 124. The mask 140 has an opening 142 therethrough to expose the capping layer 124 over the cavity 130. The masking material may comprise optical resist, polyimide or any other masking material that can absorb the accelerated atoms. The masking material is patterned using optical lithography and etching so as to be removed over the neighboring empty cavity 130 and thus form the mask 140.

Figure 1C:
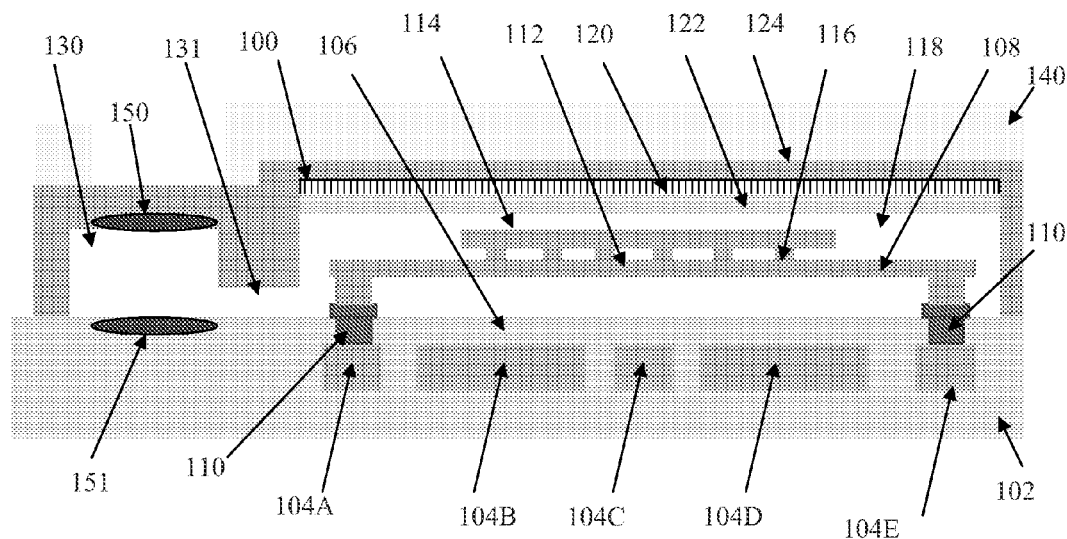
FIG. 1C shows the MEMS device and cavities of FIGS. 1A and 1B after the implantation process.

Once the mask 140 has been formed, atoms may be implanted through the mask 140 into the cavity 130. FIG. 1C shows the MEMS device 100 in which atoms have been implanted into cavity 130. The implanted atoms may include argon, helium, nitrogen, combinations thereof or any other material that forms a gas at ambient temperatures. In one embodiment, the implanted atoms comprise a gas that will not react with the materials in the cavity 118. The implanted atoms are marked in regions 150 and 151.

Figure 1D:
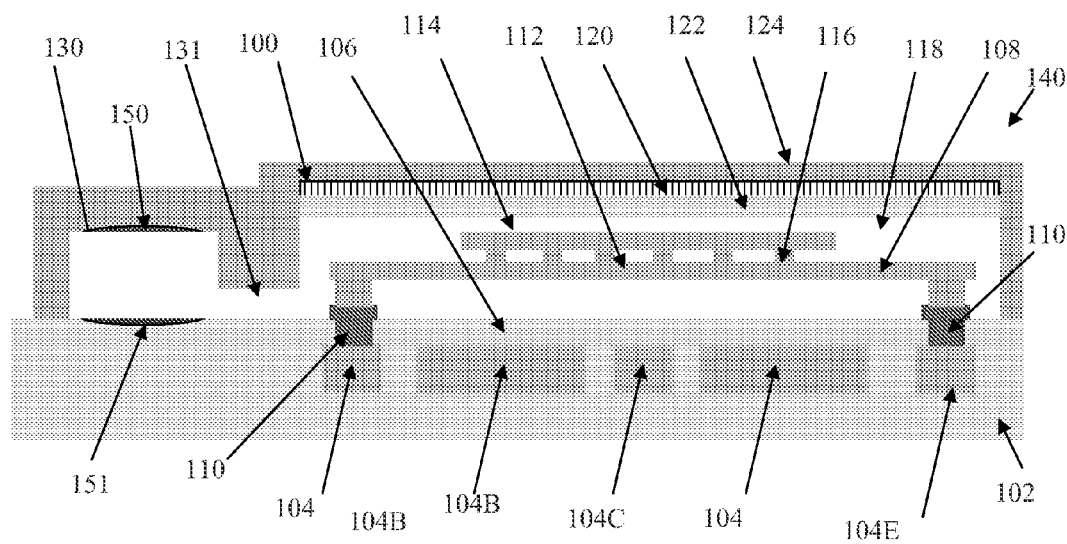
FIG. 1D shows the MEMS device and cavity of FIG. 1C after annealing and removal of the masking layer.

Following the implantation of the atoms, the MEMS device 100 can be annealed to diffuse the atoms into cavity 130, channel 131 and cavity 118. The annealing may occur at a temperature up to about 450 degrees Celsius. The mask 140 is also removed. The annealing may occur either before or after removal of the mask 140. FIG. 1D shows the MEMS device 100 after annealing and after removal of the mask 140. Due to the annealing, the gas molecules will have diffused into the cavity 118. While not shown, it is contemplated that some sacrificial material may remain within the cavity 130 and have the atoms implanted therein during the implantation process.

Figure 2A:
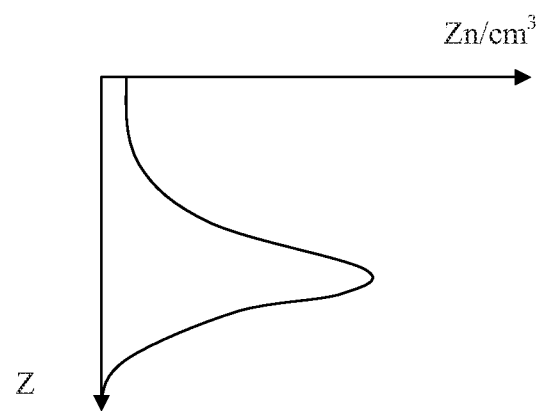
FIG. 2A shows the typical atom concentration versus depth in a solid substrate after high energy implantation.

FIG. 2A shows the typical atom concentration versus depth in a solid substrate after high energy implantation. The vertical axis shows the distance down into the substrate for a solid. The x horizontal axis shows the density of implanted atoms.

Figure 2B:
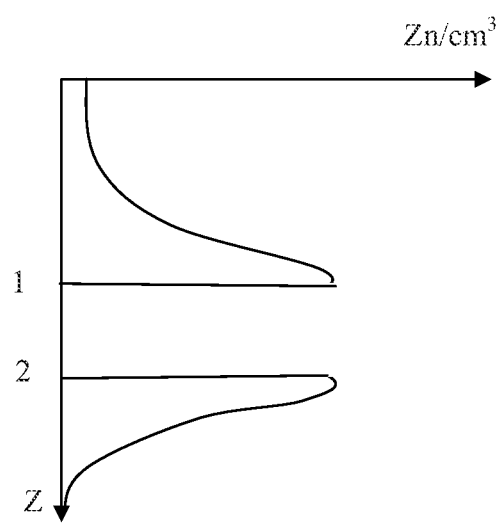
FIG. 2B shows the typical atom concentration versus depth in the cast of a cavity.

FIG. 2B shows the typical atom concentration versus depth in the cast of a cavity. The depth of the top of the cavity is marked as 1 and the depth of the bottom of the cavity is marked as 2. Because the cavity provides hardly any opportunity for the injected atoms to lose energy, the atoms that make it through to the cavity traverse the cavity and are imbedded at the bottom of the cavity. Thus the distribution is broadened by almost the thickness of the cavity. Some atoms may be reflected by the bottom of the cavity and provide some pressure.

Figure 2C:
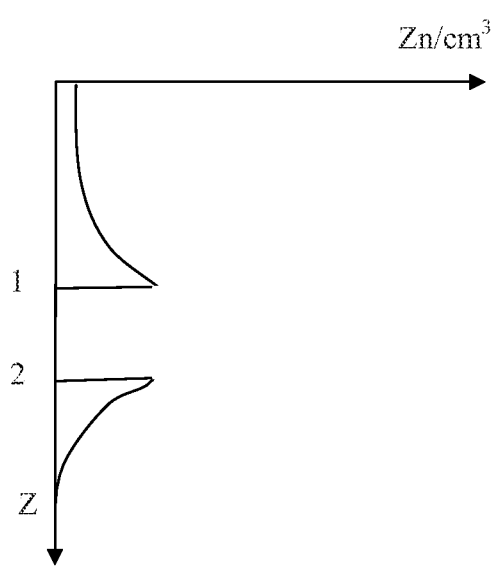
FIG. 2C show the subsequent distribution of atoms shown in FIG. 2B after annealing.

FIG. 2C show the subsequent distribution of atoms shown in FIG. 2B after annealing. The concentration gradient of implanted atoms leads to the diffusion of the atoms close to the cavity surface into the cavity providing a pressure of atoms that can reduce the impact velocity of the switching MEMs device.

In one embodiment, during the fabrication of the MEMs device 100, some of the sacrificial material may remain in cavity 130, so that the implanted atoms come to a halt in the cavity region. If this sacrificial material is porous or the atoms have a fast diffusion time, then they will be released into the joined cavities more quickly and more efficiently. The cavity 130 may also have material deposited in the cavity 130 during the fabrication stage that is not removed from the cavity during release, but will stop the implanted atoms easily, and allow them to diffuse out quickly on heating.

The invention has been described with respect to one capacitor in a cavity being part of many capacitors in a digital variable capacitor, but it is understood that the invention is applicable to cavities having multiple MEMS devices where the switching of the device causes impacts which limit the life of the device.

While the foregoing is directed to embodiments of the present invention, other and further embodiments of the invention may be devised without departing from the basic scope thereof, and the scope thereof is determined by the claims that follow.

The invention claimed is:

1. A method of MEMs fabrication, comprising:
 fabricating a MEMs device, the MEMs device having a cavity sealed by an encapsulating layer;
 implanting atoms into one of more of the encapsulating layer and another layer bordering the cavity; and
 annealing the MEMs device to release the atoms into the cavity and pressurize the cavity.

2. The method of claim 1, wherein the cavity comprises a first cavity and a second cavity that is connected to the first cavity via a channel.

3. The method of claim 2, further comprising forming a mask over the encapsulating layer.

4. The method of claim 3, wherein the implanting comprises implanting atoms into the encapsulating layer in an area bounding the second cavity.

5. The method of claim 4, wherein the atoms are selected from the group consisting of nitrogen, helium, argon, xenon, and combinations thereof.

6. The method of claim 5, wherein fabricating a MEMS device comprises:
 depositing sacrificial material over an insulating layer;
 forming a switching element in the sacrificial material;
 depositing sacrificial material over the switching element; and
 removing the sacrificial material formed over the insulating layer and the switching element.

7. The method of claim 6, wherein the sacrificial material defines boundaries of the first cavity, the second cavity and the channel.

8. The method of claim 7, wherein following removing the sacrificial material, the switching element is movable within the first cavity between a position in contact with the insulating layer and a position spaced from the insulating layer.

9. The method of claim 1, wherein the implanting comprises implanting atoms into the encapsulating layer in an area bounding the cavity.

10. The method of claim 9, wherein the atoms are selected from the group consisting of nitrogen, helium, argon, xenon, and combinations thereof.

11. The method of claim 10, wherein fabricating a MEMS device comprises:
 depositing sacrificial material over an insulating layer;
 forming a switching element in the sacrificial material;
 depositing sacrificial material over the switching element; and
 removing the sacrificial material formed over the insulating layer and the switching element.

12. The method of claim 11, wherein the sacrificial material defines boundaries of the cavity.

13. The method of claim 12, wherein following removing the sacrificial material, the switching element is movable within the cavity between a position in contact with the insulating layer and a position spaced from the insulating layer.

14. The method of claim 1, wherein fabricating a MEMS device comprises:
 depositing sacrificial material over an insulating layer;
 forming a switching element in the sacrificial material;
 depositing sacrificial material over the switching element; and
 removing the sacrificial material formed over the insulating layer and the switching element.

15. The method of claim 14, wherein the sacrificial material defines boundaries of the cavity.

16. The method of claim 15, wherein following removing the sacrificial material, the switching element is movable within the cavity between a position in contact with the insulating layer and a position spaced from the insulating layer.

* * * * *